US011021792B2

(12) United States Patent
Jeon et al.

(10) Patent No.: US 11,021,792 B2
(45) Date of Patent: Jun. 1, 2021

(54) SYMMETRIC PRECURSOR DELIVERY

(71) Applicant: Lam Research Corporation, Fremont, CA (US)

(72) Inventors: Eli Jeon, Sherwood, OR (US); Adrien LaVoie, Newberg, OR (US); Purushottam Kumar, Hillsboro, OR (US); Jeffrey Kersten, Happy Valley, OR (US); Gautam Dhar, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 211 days.

(21) Appl. No.: 16/104,871

(22) Filed: Aug. 17, 2018

(65) Prior Publication Data

US 2020/0056288 A1 Feb. 20, 2020

(51) Int. Cl.
*C23C 16/455* (2006.01)

(52) U.S. Cl.
CPC .............................. *C23C 16/45544* (2013.01)

(58) Field of Classification Search
CPC ................................. C23C 16/44; C23C 16/45
See application file for complete search history.

(56) References Cited

U.S. PATENT DOCUMENTS

| 6,743,473 B1 * | 6/2004 | Parkhe .................... C23C 16/18 257/E21.168 |
| 9,447,497 B2 | 9/2016 | Wu et al. |
| 2007/0221129 A1 | 9/2007 | Bae et al. |
| 2009/0214779 A1 | 8/2009 | Sarigiannis et al. |
| 2012/0216712 A1 * | 8/2012 | Paranjpe .................. C23C 16/56 106/287.18 |
| 2016/0056035 A1 * | 2/2016 | Toyoda .................. C23C 16/507 438/778 |
| 2017/0062212 A1 | 3/2017 | Sato et al. |

FOREIGN PATENT DOCUMENTS

| KR | 10-2005-0045442 A | 5/2005 |
| KR | 10-2012-0059697 A | 6/2012 |

OTHER PUBLICATIONS

ISR, PCT/US2019/046423, dated Dec. 3, 2019, 3 pages.

* cited by examiner

*Primary Examiner* — Matthew D Krcha
(74) *Attorney, Agent, or Firm* — Penilla IP, APC (57) ABSTRACT

A gas delivery system for a processing chamber includes a first channel for delivering a first chemistry and a second channel for delivering a second chemistry. The first channel includes a first outlet valve and the second channel includes a second outlet valve. A trickle gas source is connected to both the first and the second channels. A first junction is coupled to the first outlet valve and a second junction is connected to the second outlet valve. A common conduit connects between the first junction and the second junction. The first junction includes an input to provide a push gas from a push gas source and the second junction includes an output to a processing chamber. During operation, one of the first channel or the second channel is active at one time. A trickle gas from a trickle gas source is flowed into an active one and a non-active one of the first or second channels. A push inert gas from the push gas source is flowed into the first junction, through the common conduit and out of the second junction to the processing chamber.

20 Claims, 7 Drawing Sheets

TABLE A:

| Dia [in] | Area [in2] | Area [m2] | L [in] | L [m] |  | Pe [vL/D] |
|---|---|---|---|---|---|---|
| 0.402 | 0.126923485 | 8.1866E-05 | 1 | 0.0254 |  | 0.01 |

| P [torr] | Temp [K] | Q [sccm] | Flow to vel [m/s] | BIDH₂,0 [m2/s] |  |  |
|---|---|---|---|---|---|---|
| 50.00 | 333.15 | 0.10 | 0.00 | 1.32E-03 |  |  |

| Gas vel [in/s] | Delta distance [in] | Time delta [ms] | Pulse time [ms] | Delta time to pulse time |  |  |
|---|---|---|---|---|---|---|
| 0.0 | 1 | 67278.22 | 400 | 16819.56% |  |  |

| ID | Area | Length | Vol | %increase |  |  |
|---|---|---|---|---|---|---|
| 0.29 | 0.07 | 0.99 | 0.07 |  |  |  |
| 0.40 | 0.13 | 6.08 | 0.77 | 1080.12 |  |  |
| 0.40 | 0.13 | 3.14 | 0.40 | 509.47 |  |  |

Figure 6

SYMMETRIC PRECURSOR DELIVERY

BACKGROUND

1. Field of the Disclosure

The present embodiments relate to semiconductor substrate processing, and more particularly, to a gas delivery tool for providing different chemistry precursors to a process chamber for testing.

2. Description of the Related Art

There are many types of film deposition processes commonly used in the semiconductor fabrication field to define different types of features. Some example deposition processes to create a thin films onto a substrate include physical vapor deposition (PVD), chemical vapor deposition (CVD—e.g., plasma-enhanced CVD), or atomic layer deposition (ALD).

In a PVD process, a pure source material in liquid form is converted into a vapor precursor and delivered to the process chamber. The liquid precursor is converted to the vapor precursor in a controlled manner by employing techniques that use high power electricity, laser ablation. The vapor precursor, when applied to a substrate, condenses on the surface of the substrate to create a desired layer. There are no chemical reactions that take place in the entire process.

In the CVD process, a source material is mixed with a volatile precursor that acts as a carrier. The mixture is injected into the process chamber in which the substrate is received, in a gaseous phase to deposit films on substrates. The reactants of the mixture react with the surface of the substrate resulting in the deposition of thin films.

The ALD process is a sub-class of the CVD. The ALD is a cyclic process that is carried out by dividing a conventional CVD process into an iterated sequence of self-saturating deposition cycles. The resulting films are highly conformal, smooth and possess excellent physical properties. Unlike the CVD where the reacting gases are applied into the chamber simultaneously, the reacting gases of the ALD (i.e., precursors) are introduced sequentially to allow the gases to react with the surface of the substrate instead of with each other. ALD process involves a series of pulsing and purging steps in which layers are formed by alternately pulsing precursors, reactive gases one at a time into the process chamber and purging with inert gas in between each pulse. For example, during a first pulsing step, a first precursor is introduced as a gas, which is absorbed (or adsorbed) on a surface of the substrate received within a process chamber. This is followed by a purging step wherein the process chamber is purged of the first gaseous precursor using an inert gas. A subsequent pulsing step includes introducing a second precursor as plasma, which reacts with the absorbed precursor to form a monolayer of a desired material. A second purging step is performed to remove the second precursor along with any byproducts from the process chamber. By regulating the sequence of pulse and purge, the films produced by ALD are deposited one atomic layer at a time by repeatedly switching the sequential flow of the two or more precursors/reactive gases over the substrate.

When a new chemistry has to be tested for any of the aforementioned deposition processes, a significant amount of overhead time has to be expended. A good portion of that time is due to hardware configuration. For instance, in order to test a behavior of a new precursor in a process chamber, the new precursor has to be tested under same process conditions as a first precursor that is currently being used so that the results from the testing are comparable.

In conventional system, when different chemistries needed to be tested, the different chemistries were provided through individual channels without consideration of the effect of the hardware layout (e.g., number of fittings, line length, number of bends, etc.) in the path to the process chamber. However, pressure drop differences due to the hardware layout does not allow for easy process transparency testing. Thus, in order to have similar process conditions, the process recipes have to be adjusted so that the process recipes used for the first precursor will match with the process recipes for testing the new precursor. The pressure drop differences (a critical factor that affects the result of the testing), in these operating pressure regimes and flow rates, are mainly due to differences in line layout (i.e., types, number of fittings, number of bends, line lengths and line widths). One way to test the behavior of the new precursor using the same process recipes of the first precursor, while taking pressure drop differences into consideration, is to move the ampoule that supplies the new precursor to first precursor ampoule position. This change typically incurs at least a significant tool down time (e.g., about 5 days) due to facility safety measures that need to be followed.

It is in this context that inventions arise.

SUMMARY

Embodiments of the disclosure include a gas delivery system that allows different chemistry precursors (or simply termed chemistries) to be tested without incurring significant tool downtime. The gas delivery system accommodates a plurality of channels each having an ampoule for containing chemistry and an individual conduit for delivering the chemistry to the process chamber. The layouts of the individual conduit are matched to allow the chemistries to be supplied to a manifold within a process chamber using same process recipe. The different chemistries can be easily tested with the same process recipe without having to tweak the process recipes as each of the chemistries follows similar delivery path to the manifold of the process chamber. Further, the different chemistries are tested without incurring significant tool downtime. The only downtime that has to be incurred during the testing of different chemistries is due to a purging operation that needs to be performed between different chemistry applications. This downtime is significantly shorter than the conventional way of testing the different chemistries.

In one implementation, a gas delivery system for a processing chamber is disclosed. The gas delivery system includes a first channel for delivering a first chemistry to the processing chamber and a second channel for delivering a second chemistry to the processing chamber. The first channel has a first outlet valve and the second channel has a second outlet valve. A trickle gas source connects to both the first channel and the second channel. A first junction is coupled to the first outlet valve and a second junction is coupled to the second outlet valve. A common conduit connects between the first junction and the second junction. The first junction has an input that connects to a push gas source and the second junction has an output connecting to the processing chamber. During operation, one of the first channel flowing the first chemistry or the second channel flowing the second chemistry is active at one time. A non-active one and an active one of the first or second channels allows a trickle inert gas from the trickle gas source to flow to the first and second junctions. When either the first chemistry or the second chemistry is output by either said first or second channels, the push gas source flows a push inert gas into the first junction, through the common conduit and out of the second junction to the processing chamber.

In some implementation, the first channel includes a first ampoule with a first inlet for receiving the first chemistry from a first chemistry source and a second inlet to receive the trickle inert gas from the trickle gas source. The second channel includes a second ampoule with a first inlet for receiving the second chemistry from a second chemistry source and a second inlet to receive the trickle inert gas from the trickle gas source.

In some implementations, the first channel further includes a first valve block coupled to the first ampoule and a second channel includes a second valve block coupled to the second ampoule. Each of the first and the second valve blocks has one or more valves to regulate flow of the first or second chemistries from the first or second chemistry source into the first or second ampoule.

In some implementation, each of the first and the second ampoules includes one or more level sensors coupled to a spill detector valve. The one or more level sensors are configured to generate a signal to the spill detector valve indicative of a level of the first or the second chemistries in the first or the second ampoules. The spill detector valve is configured to control flow of the first or the second gas chemistries to the corresponding one of the first or second ampoules.

In some implementations, each component of the first and the second channels are located symmetric to each other within the gas delivery system.

In some implementations, a layout of the first channel matches a layout of the second channel.

In some implementations, the layout is defined by a total line length, a number of bends, a line width, and a number of fittings. The total line length is computed as a sum of lengths of line segments of each conduit in the first or the second channels, wherein the line segment is defined between consecutive pair of bends. Matching the layout of each conduit includes matching the total line length, the number of bends, the number of fittings and line width of each conduit in the first and the second channels.

In some implementations, a length of the common conduit between the first junction and the second junction is defined to avoid diffusion of the first or the second chemistries from an active one into a non-active one of the first or second channels.

In some implementations, the length of the common conduit between the first and the second junctions is derived as a Peclet number.

In another implementation, a gas delivery system for testing a plurality of gases in a process chamber, is disclosed. The gas delivery system includes a first channel for delivering a first chemistry to the processing chamber. The first channel includes a first ampoule coupled to a first chemistry source and a trickle gas source. The first ampoule includes a first inlet for receiving the first chemistry from a first chemistry source, and a second inlet for receiving an inert gas from the inert gas source. The first channel includes a first outlet valve. The gas delivery system also includes a second channel for delivering a second chemistry to the processing chamber. The second channel includes a second ampoule coupled to a second chemistry source and the trickle gas source. The second ampoule includes a first inlet for receiving the second chemistry from the second gas source, and a second inlet for receiving the inert gas from the inert gas source. The second channel includes a second outlet valve. A first junction is coupled to the first outlet valve and has an output connecting to a push gas source. A second junction is coupled to the second outlet valve and has an output connecting to the processing chamber. A common conduit connects between the first junction and the second junction. During operation, one of the first channel flowing the first chemistry or the second channel flowing the second chemistry is active at one time. A trickle inert gas from the trickle gas source is flowed through a non-active one and an active one of the first or second channels to the first and second junctions. When either the first or second chemistries is output by the first or second channels, the push gas source flows a push inert gas into the first junction, through the common conduit and out of the second junction to the processing chamber.

In some implementations, the first channel includes a first valve block located between the first chemistry source and the first ampoule. The first valve block has one or more valves to regulate flow of the first chemistry from the first chemistry source into the first ampoule. The second channel includes a second valve block located between the second chemistry source and the second ampoule. The second valve block has one or more valves to regulate flow of the second chemistry from the second chemistry source into the second ampoule.

In some implementations, each of the first and the second ampoules includes one or more level sensors coupled to a spill detector valve. The one or more level sensors is configured to monitor level of the gas chemistries in the first or the second ampoules and generate a signal to the spill detector valve indicative of a level of the first or second chemistries in the first or the second ampoules. The spill detector valve is configured to control flow of the first or second chemistries to the first or the second ampoules.

In some implementations, each of the first and the second ampoules is coupled to a manometer. The manometer is configured to control pressure of the first or the second chemistries flowing from the first or the second ampoules toward the first or the second outlet valves.

The various implementations offer a simple and easily implementable way of testing multiple precursor gases by providing a gas delivery system design that accommodates multiple ampoules for storing different chemistries with each ampoule being coupled to a distinct conduit for supplying the respective precursor gas to a manifold of the process chamber. The design of the gas delivery system allows the various chemistries to be tested using same valve times for all chemistries without incurring significant tool down-time.

Some advantages of the gas delivery system described herein is the ability to be able to test various chemistries (also referred to as precursors or gases) using same process recipes without having to break any lines to switch the ampoules. The ampoules independently supply the various gases to a manifold within the process chamber using the respective conduits that have a matching layout. The only delay in testing different chemistries is due to purging operation where the first gas supplied to a manifold in the process chamber has to be thoroughly purged before allowing the second gas to be supplied to the same manifold. Further, by matching an overall layout of each of the conduits, valve timings are maintained during testing of the different chemistries while avoiding pressure drop differences that are a result of line layout mismatch. A diffusion distance is maintained between a first conduit and a second conduit so as to avoid the first chemistry flowing through the active first channel from diffusing into the non-active second channel or the second chemistry flowing through the active second channel from diffusing into the non-active first channel. To further safeguard the chemistry flowing through the active channel from diffusing into the non-active channel, sufficient amount of trickle inert gas is trickled through the non-active channel so as to provide momentum to the chemistry supplied through the active channel while preventing occurrence of any diffusion of the chemistry into the non-active channel. The momentum assists in pushing the chemistry toward the manifold while ensuring that flow or chemical composition of the chemistry supplied by the active channel does not get adversely affected by the inert gas. Additional inert gas may be supplied through the common conduit to further assist the chemistry supplied through the first channel or the second channel to flow toward the manifold of the processing chamber.

These and other advantages will be discussed below and will be appreciated by those skilled in the art upon reading the specification, drawings and the claims.

DESCRIPTION

In the following description, numerous specific details are set forth in order to provide a thorough understanding of the present inventive features. It will be apparent, however, to one skilled in the art that the present invention may be practiced without some or all of these specific details. In other instances, well known process operations have not been described in detail in order not to unnecessarily obscure the present invention.

Embodiments of the disclosure provide details of a gas delivery system that is used to provide gases for testing in a process chamber. The gas delivery system includes distinct channels with ampoules to store different gas precursors and a set of inlet and outlet valves for regulating the flow of the gas precursors to the process chamber for testing. Conduits provided in the gas delivery system are used to supply the gas precursors to a manifold in the process chamber. The manifold supplies the gas precursors to a showerhead, which, in turn, supplies the gas precursors to a processing region within the process chamber. The conduits are designed to match in layout so as to ensure that there are no pressure drop differences between the two or more gas precursors that are being tested using the gas delivery system. Additionally, the layout design of the conduits addresses any dead-legs that might be caused due to intermittent flow of chemistries, and provide sufficient separation distance between the conduits supplying different chemistries so as to avoid backflow diffusion into non-active conduits. The gases can be tested with minimal downtime as the only downtime is to purge the manifold of the previously supplied precursor and is not due to switching of ampoules. It should be noted that the gas precursors are also referred to herein as gas chemistries or first, second chemistries.

Figure 1A:
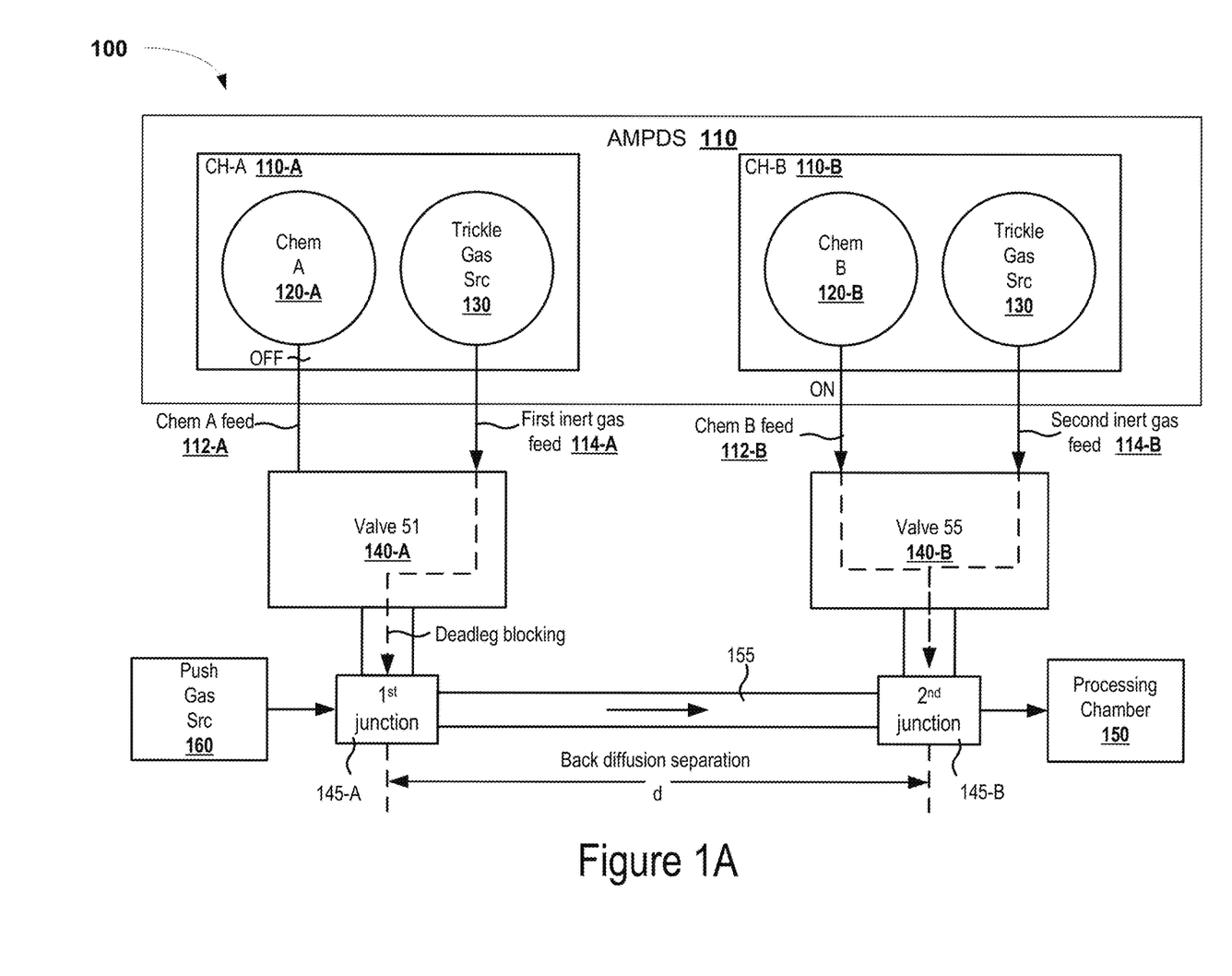
FIG. 1A illustrates a simplified block view of an ampoule delivery system that is used to test different chemistry precursors, in one implementation.

FIG. 1A illustrates a simplified block diagram of a process system 100 that is used to test chemistry B precursor, in one implementation. The process system 100 includes a process chamber 150 that receives different gases, including gas precursors that are being tested. The process chamber 150 may be a single-station or a multi-station chamber. A top portion (or top plate—not shown) of the process chamber 150 includes a showerhead (not shown) that is connected to a manifold (not shown). The manifold receives gases from the different gas sources and supplies these gases to the showerhead for onward delivery to a processing region defined over a station within the process chamber 150. A gas delivery system (AMPDS) 110 within the process system 100 is used to provide different gas precursors for testing within the process chamber 150. The AMPDS 110 includes a plurality of ampoules that receive gas precursors from different gas sources and supplies them to the manifold in the process chamber 150. In the implementation shown in FIG. 1A, the AMPDS includes a first channel (channel A or Ch-A) 110-A for delivering a first chemistry (chemistry A) and a second channel (channel B or Ch-B) 110-B for delivering a second chemistry (chemistry B). The first channel 110-A includes a first ampoule (not shown) that is connected to a first gas source 120-A to receive the first chemistry via chemistry A feed and to a trickle gas source 130 to receive a trickle inert gas via an first inert gas feed. The first channel includes a first outlet valve that is coupled to the first ampoule and is configured to receive the first chemistry provided through the chemistry A feed and the trickle inert gas provided through the first inert gas feed. The first outlet valve is coupled to a first junction 145-A.

Similarly, the second channel 110-B includes a second ampoule (not shown) that is connected to a second gas source 120-B to receive the second chemistry via chemistry B feed and to the trickle gas source 130 to receive the trickle inert gas via a second inert gas feed. The second channel includes a second outlet valve that is coupled to the second ampoule and is configured to receive the second chemistry supplied through the chemistry B feed and the trickle inert gas supplied through the second inert gas feed. The second outlet valve is coupled to a second junction 145-B. The first and second channels are selectively kept active or in-active when specific ones of the chemistries needs to be tested.

A plurality of inlet and outlet valves provided within the AMPDS regulates flow of the first and the second chemistries supplied through the corresponding first and second channels. The first junction 145-A is connected to the second junction 145-B through a common conduit 155. The first junction includes an input that is coupled to a push gas source 160 to receive a push inert gas. The second junction 145-B includes an output that is connected to the processing chamber 150 to supply the chemistries to the processing chamber 150.

The implementation illustrated in FIG. 1A shows the flow of the different chemistry feeds when chemistry B is being tested. In this implementation, channel A 110-A is made inactive by turning off the flow of the first chemistry (Ch-A) through the chemistry A feed 112-A and the first ampoule to the first outlet valve 140-A. At the same time, trickle inert gas is allowed to flow from the trickle gas source 130 through the first inert gas feed 114-A and the first outlet valve (Valve 51) 140-A toward the first junction 145-A. Channel B is kept active by turning on the flow of the second chemistry (Ch-B) through the chemistry B feed 112-B and the second outlet valve (valve 55) 140-B toward the second junction 145-B. Further, trickle inert gas is allowed to flow from the trickle gas source 130 through the second inert gas feed 114-B to the second outlet valve 140-B. The trickle inert gas provided through the second channel mixes with the second chemistry and acts as a carrier providing momentum to the second chemistry flowing through the second outlet valve 140-B toward the second junction 145-B. A push gas source 160 is activated to allow push inert gas from the push gas source 160 to flow through the first junction 145-A and the common conduit 155 toward the second junction 145-B. The push inert gas mixes with the trickle inert gas from the first channel at the first junction and the second chemistry/trickle inert gas mixture flowing into the second junction 145-B from channel B 110-B. The combined mixture of the second chemistry and the inert gas flows out through the second junction 145-B to a manifold (not shown) in the processing chamber 150. The manifold supplies the mixture to a processing region defined over a substrate support surface of a station in the processing chamber 150, through a showerhead available in an upper chamber portion of the processing chamber 150.

The trickle inert gas flowing through the first inert gas feed fills a path that extends from the first ampoule and the first valve 51 to the first junction 145-A to avoid any dead-legs along the path in the first channel. Dead-legs usually occurs in a non-active channel in areas along the path used for delivering a chemistry (e.g., a first chemistry or a second chemistry), due to intermittent use of the conduits. By flowing the trickle inert gas, sufficient positive pressure is provided in the dead zones in the non-active channel that cause the dead-legs. An amount of trickle inert gas that is flowed through the non-active channel is minimal so as to provide sufficient pushing force while ensuring that a chemical composition of the gas chemistry flowing through the active channel is not adversely affected.

A distance between the first junction and the second junction is defined to prevent backflow of the chemistry from the active channel into the non-active channel. In the example illustrated in FIG. 1A, the first junction is spaced apart from the second junction so as to prevent chemistry B supplied through the second channel from diffusing into a flow path defined in the first channel. The push inert gas introduced through the first channel flows toward the second junction substantially filling the common conduit up to the second junction further preventing backflow diffusion of the second chemistry into the first junction of the first channel. Further, the push inert gas from the push gas source 160 provides a push force to the second chemistry flowing into the second junction so that the push inert gas along with the second chemistry flows out of the second junction toward the processing chamber 150. In some implementations, both the push inert gas and the trickle inert gas are same. In other implementations, the push inert gas is different from the trickle inert gas. In some implementations, the push inert gas and the trickle inert gas are both Argon. In other implementations, other inert gases may be used.

Figure 1B:
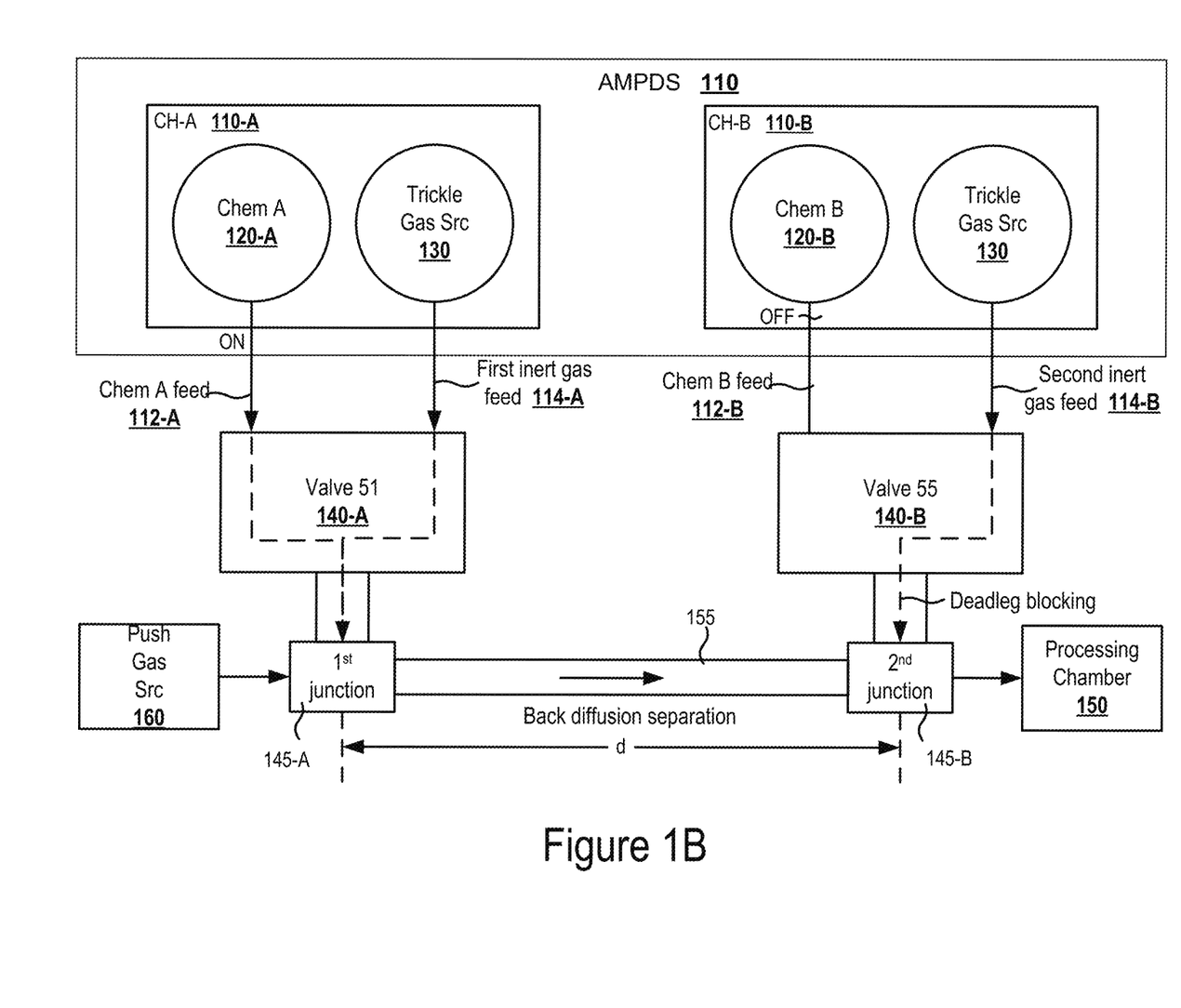
FIG. 1B illustrates a simplified block view of an ampoule delivery system used to test different chemistries, in an alternate implementation.

FIG. 1B shows an alternate implementation of a flow of the different chemistry feeds within the process system illustrated in FIG. 1A, when chemistry A is being tested. In this implementation, channel B 110-B is made inactive by turning off the flow of the second chemistry (Ch-B) through the chemistry B feed and the second ampoule to the second outlet valve 140-B. At the same time, trickle inert gas is allowed to flow from the trickle gas source 130 through the second inert gas feed and the second outlet valve (Valve 55) 140-B toward the second junction 145-B. Channel A is kept active by turning on the flow of the first chemistry (Ch-A) from the first gas source 120-A through the chemistry A feed and the first outlet valve 140-A toward the first junction 145-A. Trickle inert gas is allowed to flow from the trickle gas source 130 through the first inert gas feed to the first outlet valve (Valve 51) 140-A. The trickle inert gas mixes with the first chemistry (Ch-A) and acts as a carrier providing momentum to the first chemistry flowing through the first outlet valve 140-A toward the first junction 145-A. The push gas source 160 is activated to allow push inert gas from the push gas source 160 to flow toward the first junction 145-A and push the first chemistry outward from the first junction 145-A through the common conduit 155 toward the second junction 145-B. The first chemistry/trickle inert gas mixture mixes with the push inert gas flowing into the first junction 145-A and the trickle inert gas flowing from the second outlet valve 140-B of channel B 110-B into the second junction 145-B. The combined mixture of the first chemistry and the inert gas is pushed out through the second junction 145-B to the manifold in the processing chamber 150. The manifold supplies the first chemistry to the processing region defined over the substrate support surface of the station in the processing chamber 150, through a showerhead of the processing chamber 150.

In some implementation, each station in the processing chamber includes a separate manifold and the different chemistries may be tested by providing the different chemistries to the manifold. The different chemistries may be tested by sequentially activating the first channel and then the second channel. After each chemistry application a purge operation is performed to thoroughly purge the manifold of the previous chemistry before applying the next chemistry. For example, with reference to FIGS. 1A and 1B, after the testing of chemistry B, the flow of chemistry B is shut off and an inert gas is flowed into the manifold to completely purge chemistry B from the manifold. After the purge operation, flow of chemistry A is turned and chemistry A is tested.

Channels A and B include individual conduits that are used for supplying the first and second chemistries to the first and second junctions, respectively. In order to avoid pressure drop differences, a layout of the conduit in channel A is matched to a layout of the conduit in channel B so that chemistries A and B are tested using the same process recipes (i.e., process parameters). Some of the process parameters considered during testing of the different chemistries include processing chamber operating temperature, processing chamber operating pressure, flow rate of the different chemistries, valve timing, etc. The design of the gas delivery system has to take into consideration one of the key parameters—namely, valve timing, in order to avoid pressure drop differences across the conduits during testing of the different chemistries. To maintain consistent valve timing in the conduits used for testing the different chemistries, the layout of the conduits in the channels has to be kept same to allow the different chemistries to follow similar path to the processing chamber. The layout of the conduit is defined by the geometry of the conduit and includes a total line length of each conduit, line width, number of bends, and number and type of fittings. The total line length of each conduit is defined as a sum of the line segments that make up the total conduit line, with each line segment defined between any two consecutive bends. With similar process recipes, the results from the testing of the first and the second chemistries are comparable.

It should be noted that although various implementations are discussed with reference to a gas delivery system that includes two channels for testing two different chemistries without significant tool down-time due to tuning process and facility maintenance protocol, the implementations can be easily extended to include n channels to test n different chemistries.

Figure 2:
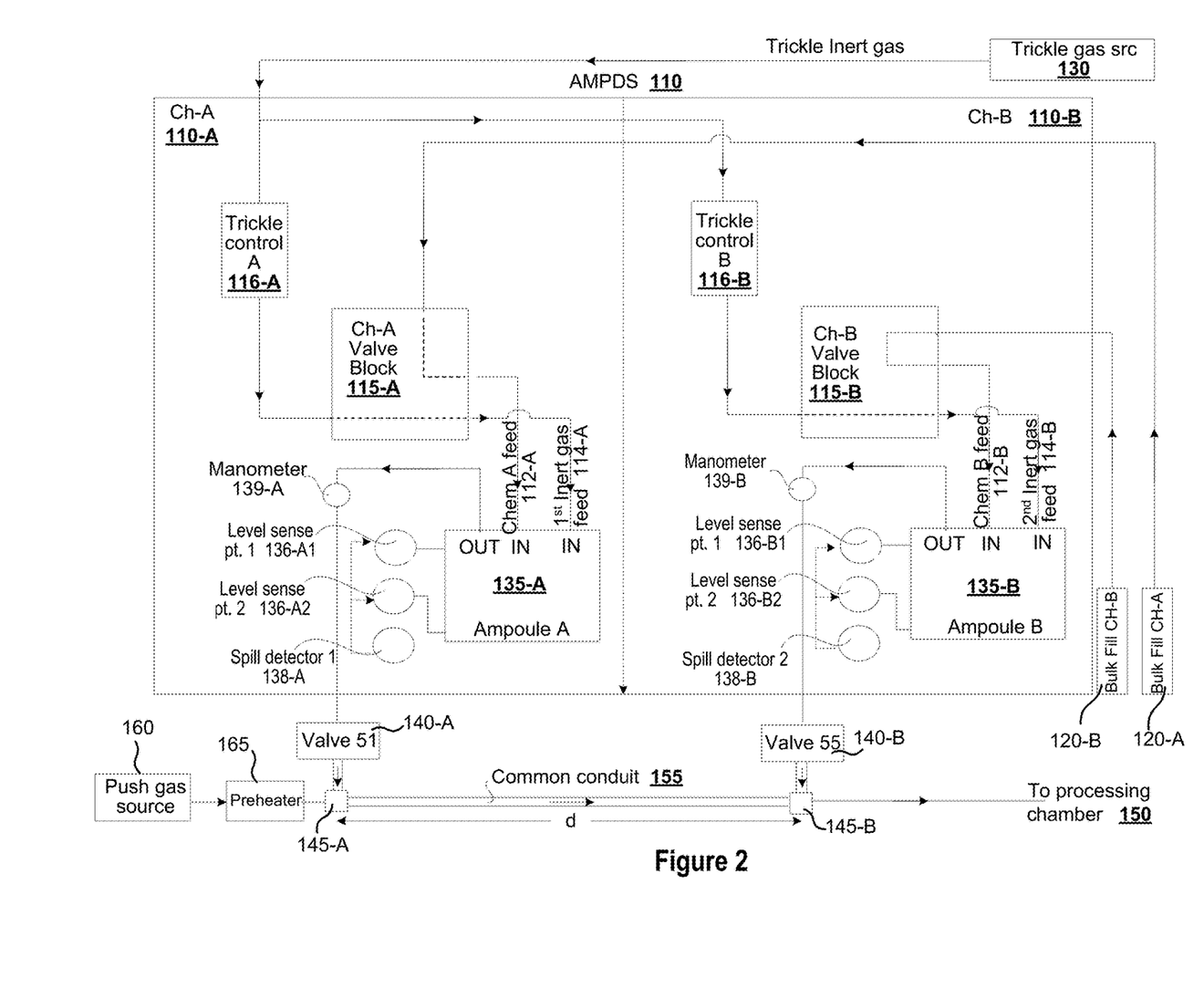
FIG. 2 illustrates a simplified block diagram of a gas delivery system that is used to provide gaseous precursors to a process chamber, for testing, in one implementation.

FIG. 2 illustrates the various components of the gas delivery system used in the process system of FIG. 1 for testing different chemistries in a processing chamber 150, in one implementation. The gas delivery system includes a plurality of channels, with each channel having an ampoule that is used to receive a different chemistry that is to be tested. The gas delivery system with the ampoules is otherwise termed ampoule delivery system (AMPDS). In the implementation illustrated in FIG. 2, a pair of channels, channels A and B, is provided for testing two chemistries, chemistry A and chemistry B. When more than two chemistries are to be tested, the AMPDS may include corresponding number of channels with an ampoule in each channel.

Each of the first and second channels (channel A 110-A, channel B 110-B), of the pair of channels includes an ampoule (first ampoule 135-A in channel A, second ampoule 135-B in channel B) for providing a first chemistry or second chemistry to the processing chamber 150. Each of the ampoules (135-A, 135-B) is connected to a corresponding chemistry source (first chemistry source 120-A, second chemistry source 120-B) through a corresponding valve block (first valve block 115-A, second valve block 115-B). The valve block (115-A, 115B) disposed between the corresponding chemistry source (120-A, 120-B) and the ampoule (135-A, 135-B) includes one or more valves to regulate flow of the chemistry from the corresponding chemistry source (120-A, 120-B) to the ampoule (135-A, 135-B). Each of the ampoules (135-A, 135-B) is also connected to a trickle gas source 130. A trickle control (116-A, 116-B) located between the trickle gas source 130 and the corresponding valve block (115-A, 115-B) controls the flow of the trickle inert gas, such as Argon, into the ampoule (135-A, 135-B). Each of the ampoules (135-A, 135-B) includes a pair of inlets and an outlet. The chemistry (chem. A, chem. B) from the corresponding chemistry source (120-A, 120-B) is supplied to the respective ampoule (135-A, 135-B) through a first inlet and the trickle inert gas is supplied through a second inlet. The trickle inert gas supplied to the ampoule (135-A, 135-B) provides the momentum to the chemistry (first chemistry or second chemistry) received within the respective ampoule (135-A, 135-B) to push the chemistry through a corresponding outlet to a manifold of the processing chamber 150. The outlet of each ampoule (135-A, 135-B) is connected to a common conduit 155. The first junction 145-A, second junction 145-B connects the AMPDS to the processing chamber 150 through the common conduit.

The connection from the outlet of each ampoule (135-A, 135-B) to the corresponding junction (145-A, 145-B) is through a corresponding outlet valve, (valve 51 140-A, valve 55 140-B). A manometer (139-A, 139-B) is provided along the connection to control pressure of the chemistry (first chemistry A, second chemistry B) that is being supplied to the corresponding junction (145-A, 145-B). The connection in each channel is in the form of a conduit, with each conduit having a defined layout. Each of the outlet valves (valve 51 140-A, valve 55 140-B) is used to regulate the flow of the chemistry flowing through the respective conduit to the common junction.

The layout of each conduit may be based on the location of the ampoule and the layout of the different modules in relation to the ampoule within the gas delivery system (AMPDS). For example, due to presence and location of other connections/pipes/control modules/parts, etc., in the AMPDS and the location of each conduit, one or more segments in each conduit may have to be routed to go around some of the existing connections. The layout of each conduit is defined by a number of bends, line segments between consecutive pair of bends, a number of fittings and line width of the conduit in each line segment. The line width of each conduit is maintained uniform throughout the total length of the conduit. In order to avoid pressure drop differences in the conduits, the layout of the first conduit providing the first chemistry is matched with the layout of the second conduit providing the second chemistry. Matching the layout includes matching the number of bends, number of segments, total line length of the conduit, number of fittings, and line width. The total line length of a conduit is computed as a sum of line lengths of line segments, with each line segment defined between any pair of consecutive bends. In some implementations, as the path taken by the first chemistry toward the processing chamber includes a length of a segment of the common conduit between the first and second junctions, the total line length of the first conduit may also include the length of the segment of the common conduit between the first and the second junctions.

Each of the ampoules (ampoule A 135-A, ampoule B 135-B) includes a one or more level sensors (136-A1, 136-A2 for ampoule A, 136-B1, 136-B2 for ampoule B) to detect level of the chemistry in the respective ampoule, when the respective channel is active. A first level sensor may be provided near the top of each ampoule to detect when the ampoule is full and a second level sensor may be provided near a bottom of each ampoule to detect when the ampoule is empty. Each of the level sensors are, in turn, connected to a spill detector 138 (138-A, 138-B) to detect when the respective ampoule is full and to generate a signal to shut the chemistry feed supplying the chemistry (chemistry A to ampoule A, chemistry B to ampoule B). For example, when channel A is active, the spill detector 138-A may use signals originating from the level sensors 136-A1 and 136-A2 to determine the level of the chemistry A within ampoule A 135-A. Based on the signals, the spill detector 138-A may provide a signal to one or more valves within channel A valve block 115-A so as to control flow of chemistry A into the ampoule A 135-A. In some implementations, the flow control may including shutting-off the flow of chemistry A into ampoule A 135-A.

In the implementation illustrated in FIG. 2, the outlet valves (valve 51 140-A, valve 55 140-B) are shown to be outside the gas delivery system (AMPDS 110). In alternate implementations, the outlet valves may be located inside AMPDS 110. A push gas source 160 is connected to the common conduit 155 at an inlet defined in the first junction. The push gas source 160 is configured to provide push inert gas to the first junction 145-A. A preheater 165 located between the push gas source and the first junction is used to heat the push inert gas before it is supplied to the first junction 145-A. When the first channel is active, the heated push inert gas is used to push the first chemistry supplied by the first channel to the first junction, through the common conduit and the second junction out to the processing chamber 150. When the first channel is inactive and the second channel is active, the push inert gas is used to fill the common conduit 155 and push the second chemistry supplied by the second channel out through the second junction 145-B toward the processing chamber 150.

It should be noted that the various modules/parts of the two channels are symmetrically located within the AMPDS, so as to provide same process parameters for the chemistries that are being tested. For example, the two ampoules (ampoule A, ampoule B) are located symmetric to one another. The two outlets and the conduits leading from the two outlets to the corresponding outlet valves (first outlet valve 145-A, second outlet valve 145-B) are also located symmetric to one another in order to ensure that the chemistries that are supplied by the two channels follow similar path to the processing chamber. In one implementation, the total line length of the conduit leading from ampoule A of channel A includes a diffusion distance 'd' separating the first junction and the second junction. Details of total line length computation will be discussed in detail with reference to FIG. 4.

When a first chemistry is to be tested, the Channel A is turned active and channel B is turned inactive. As a result, one or more valves from channel A valve block 115-A is kept open to allow first chemistry, chemistry A, to flow from first chemistry source 120-A through chemistry A feed 112-A and the first inlet into the ampoule A 135-A. Simultaneously, the trickle control A 116-A is turned on to allow trickle inert gas to flow from the trickle gas source 130 through the channel A valve block 115-A, the first inert gas feed 114-A and the second inlet to the first ampoule A 135-A. The first level sensor 136-A1 near the top of the ampoule A and the second level sensor 136-A2 near the bottom of the ampoule A provide the signals to the first spill detector 138-A. Based on the signals, the first spill detector 138-A may send a control signal to the one or more valves in the first valve block to control flow of the first chemistry into the ampoule A. The first chemistry/inert gas mixture within ampoule A flows out of the outlet, through the first conduit and the first outlet valve 51 140-A toward the first junction 145-A. Simultaneously, push inert gas from the push gas source 160 is supplied to the preheater 165, where it is heated, and the heated push inert gas is supplied to the first junction 145-A. The push inert gas pushes the first chemistry supplied by channel A through the common conduit 155 toward the second junction 145-B.

Setting channel B inactive includes turning off the flow of chemistry B from the second chemistry source 120-B while allowing the flow of the trickle inert gas from the trickle gas source 130. Accordingly, one or more valves in the channel B valve block 115-B that control the flow of chemistry B from second chemistry source 12-B is shut off and the second trickle control B 116-B is kept active to allow trickle inert gas to flow from the trickle gas source 130 through channel B valve block 115-B, the second inert gas feed 114-B and the second inlet to ampoule B 135-B. The trickle inert gas fills ampoule B 135-B and flows out of the outlet through the second conduit, second outlet valve 55 140-B toward the second junction 145-B. The trickle inert gas flowing out of the second channel 110-B is to fill the second conduit to avoid dead-leg blocking.

The forward momentum of the push inert gas and the chemistry A/trickle inert gas mixture from the channel A is further aided by the trickle inert gas flowing from channel B at the second junction. The trickle inert gas supplied from channel A acts as a carrier for chemistry A flowing toward the processing chamber 150 and the push inert gas and the trickle inert gas supplied from channel B provide sufficient momentum to chemistry A as chemistry A flows toward the processing chamber. The amount of the trickle inert gas supplied by both the channel A and channel B and the push inert gas provide sufficient momentum to move chemistry A toward the processing chamber without adversely affecting the composition of chemistry A that is being tested in the processing chamber.

The first junction (i.e., an entry point for the first chemistry from the AMPDS first channel to the common conduit) is spaced sufficiently apart from the second junction to prevent or minimize backflow diffusion of the chemistry flowing from the active channel into the conduits within the non-active channel. A length of the common conduit between the first junction and the second junction (i.e., diffusion distance separating the conduits from the first and second channels) is derived as a Peclet number. Peclet number (Pe) is defined as a ratio of a rate of advection of a physical quantity by the flow to the rate of diffusion of the same quantity driven by an appropriate gradient. For example, the Peclet number for mass transfer of a chemistry bulk is defined as:

$$Pe_L = Lu/D,$$

where L is the characteristic length, u is the flow velocity of the chemistry, and D is the mass diffusion coefficient.

From the above Peclet number formula, the optimal diffusion distance to prevent backflow diffusion was determined to be about 1", in one implementation. Backflow diffusion occurs when an area of lower pressure is encountered along the flow path of the chemistry as it flows from a region of higher pressure towards a region of lower pressure. For example, when channel A is active, the ampoule and the conduits of channel A are at higher pressure while the processing chamber is at a lower pressure. This results in chemistry A, supplied by channel A, to flow toward the processing chamber. Along its path to the processing chamber, chemistry A may pass through an area of lower pressure—e.g., the second junction and the conduits up toward the ampoule B, due to the non-active channel B. In order to prevent the diffusion of the chemistry A into the second junction and up the conduit of the second channel leading to the second ampoule, sufficient separation distance is maintained between the first junction and the second junction. In addition the trickle inert gas is flowed through the second channel so as to fill the conduit of the second channel leading up to the second junction, including the second outlet valve. Similarly, when channel B is kept active and channel A is kept non-active, the diffusion distance 'd' and the flow of the trickle inert gas through the conduit of the non-active channel A fills the conduit leading from ampoule A to the first junction, including the first outlet valve, so as to prevent backflow diffusion into the first outlet valve, and the conduit of the non-active channel A.

Figure 3:
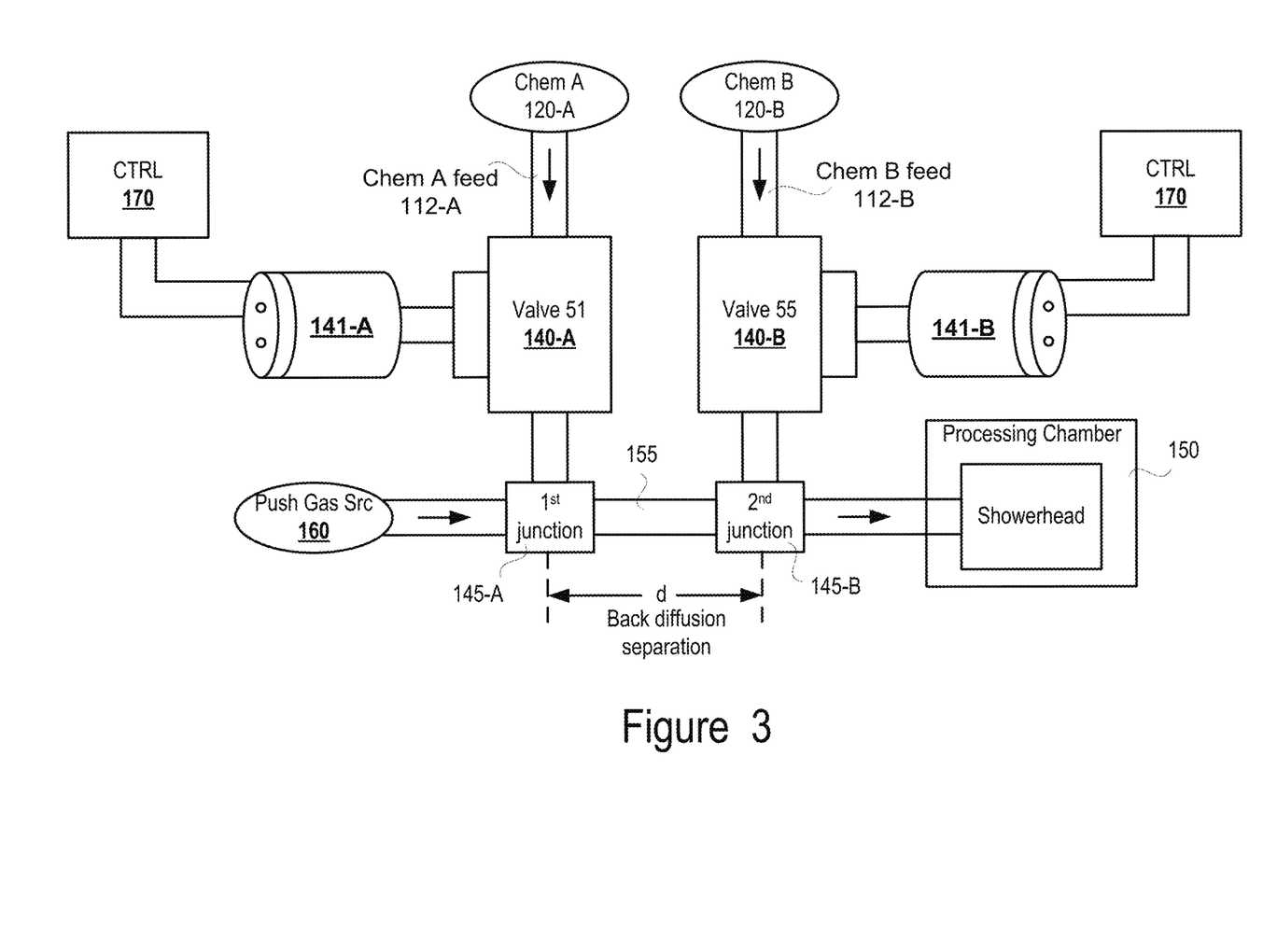
FIG. 3 illustrates a simplified block view of outlet valves that are used to control flow of the gas chemistries toward the process chamber, in one implementation.

FIG. 3 illustrates a view of the controls used to operate the different outlet valves (140-A, 140-B) of the gas delivery system illustrated in FIGS. 1 and 2, in one implementation. It should be noted that sizes of the various parts of the gas delivery system may have been exaggerated in order to provide a clear view of the various parts, whereas in reality, the sizes of the various parts may be different than what is shown. As shown, the first outlet valve (valve 51 140-A) controls the flow of the first chemistry (chem A) from the first chemistry source to the first junction 145-A and the second outlet valve (valve 55 140-B) controls the flow of the second chemistry (chem B) from the second chemistry source to the second junction 145-B. Each of the first and the second outlet valves is coupled to a control mechanism (141-A, 141-B) for controlling the flow of the first, second chemistries through the respective outlet valves 140-A, 140-B. The control mechanism may be a pneumatic control mechanism or can be any other type of control mechanism including mechanical, electrical, etc. Each of the control mechanisms (141-A, 141-B) is coupled to a controller 170 that is used to control operation of the processing chamber 150. The controller 170 can be coupled to a computer (not shown) to allow remote control of the outlet valves 140-A, 140-B by providing inputs to the control mechanisms 141-A, 141-B. Although FIG. 3 shows two different controllers 170, the two controllers may be part of a single controller coupled to the computer or may be separately coupled to the computer. Other parts of the gas delivery system illustrated in FIG. 3 are similar to the parts discussed with reference to FIGS. 1 and 2 and are represented using same reference numerals.

Figure 4:
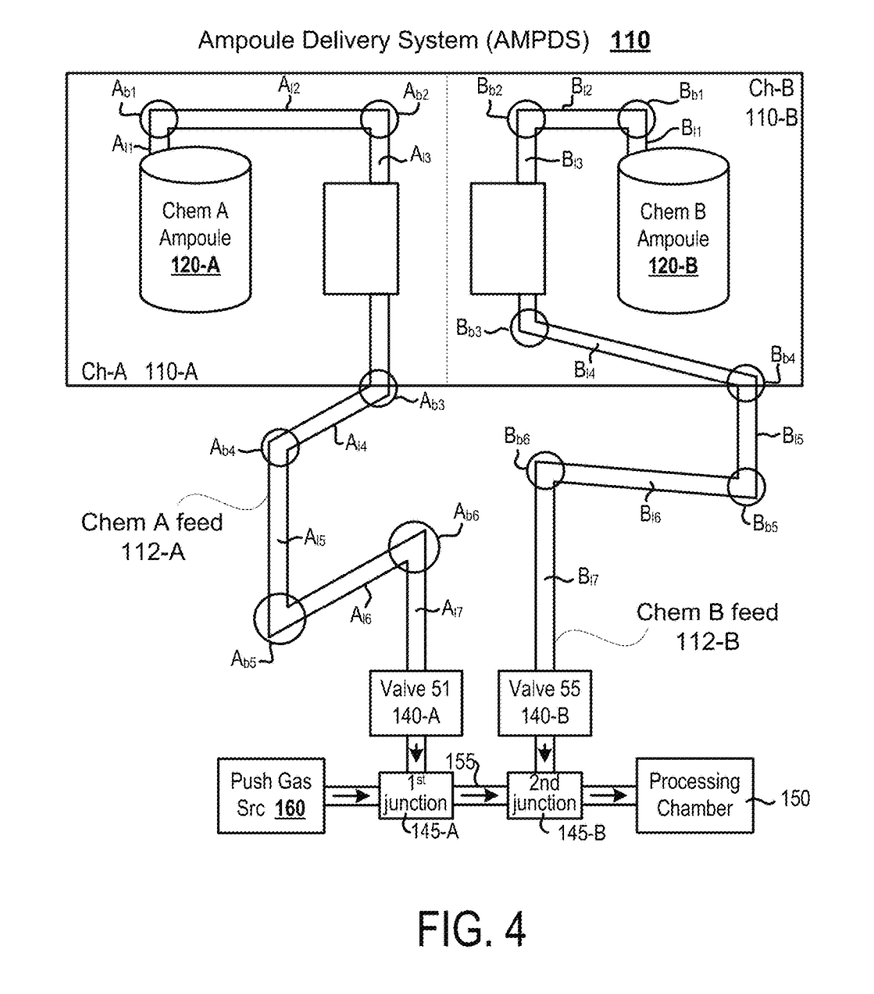
FIG. 4 illustrates a simplified block view of geometry of conduits used to supply different gases from an ampoule delivery system to a process chamber, in one implementation.

FIG. 4 illustrates an example gas delivery system depicting a layout of the two channels (channels A, B—110-A, 110-B) that supply the different chemistries to a processing chamber 150, in one implementation. Each of the channels (110-A, 110-B) includes a conduit extending from a corresponding ampoule (120-A, 120-B) through an outlet valve to a junction on a common conduit 155 that supplies the different chemistries to the processing chamber. In the example layout shown in FIG. 4, channel A includes a chemistry A ampoule 120-A and a conduit (i.e., chemistry A feed 112-A) extending from the chemistry A ampoule through outlet valve 51 140-A to a first junction 145-A defined on a common conduit 155 leading to the processing chamber 150. Similarly, channel B includes a chemistry B ampoule 120-B and a conduit (i.e., chemistry B feed 112-B) extending from the chemistry B ampoule through outlet valve 55 140-B to a second junction 145-B defined on the common conduit 155.

The gas delivery system is designed to match a layout of conduit 112-A of channel A with a layout of conduit 112-B of channel B. The layout of a conduit is defined by various conduit attributes, such as a line width, a number of bends, a number of fittings, a total line length, etc. A line width of each conduit (112-A, 112-B) of channels A and B is kept uniform throughout its length. Further, the line width of conduit 112-A in channel A matches the line width of conduit 112-B in channel B. The conduits in channels A and B include a plurality of line segments and a plurality of bends along its length. Each line segment is defined between any consecutive pair of bends or between a fitting and a module (e.g., ampoule, outlet valve, junction, etc.) of the gas delivery system, and has a line length. Matching a layout of conduit 112-A with a layout of conduit 112-B includes matching a number of bends in the conduit 112-A with the number of bends in conduit 112-B of channel B. In the example illustrated in FIG. 4, total number of bends along the length of conduit 112-A of channel A (i.e., the six bends represented by $A_{b1}$, $A_{b2}$, $A_{b3}$, $A_{b4}$, $A_{b5}$, and $A_b$), matches the total number of bends along the length of conduit 112-B of channel B (i.e., six bends represented by $B_{b1}$, $B_{b2}$, $B_{b3}$, $B_{b4}$, $B_{b5}$ and $B_{b6}$). The length of each line segment of conduit 112-A may or may not match the length of the corresponding line segment of conduit 112-B. In the case where each line segment of conduit 112-A does not match with corresponding line segment of conduit 112-B, a total line length of conduit 112-A of channel A matches a total line length of conduit 112-B of channel B. The total line length is computed as a sum of line lengths of each line segment. Thus, in the example illustrated in FIG. 4, the length of line segment $A_{11}$ of conduit 112-A of channel A may not be equal to length of corresponding line segment $B_{11}$ of conduit 112-B of channel B, the length of line segment $A_{12}$ may not be equal to length of line segment $B_{12}$, and so on. However, the total line length, $A_{t1}$, of conduit 112-A of channel A, represented by $(A_{11}+A_{12}+A_{13}+A_{14}+A_{15}+A_{16}+A_{17})$ is designed to be equal to total line length, $B_{t1}$, of conduit 112-B of channel B, represented as a sum of $(B_{11}+B_{12}+B_{13}+B_{14}+B_{15}+B_{16}+B_{17})$. In some implementations, the computation of total line length of conduit 112-A may consider the distance of separation of the two conduits (i.e., the diffusion distance between the first, second junctions, 145-A, 145-B along the common conduit) as the chemistry from channel A flows through the length of common conduit connecting the two junctions.

The gas delivery system can be designed to test more than two chemistries by including equivalent amount of channels each equipped with an ampoule. The chemistries are supplied through the respective chemistry feeds (i.e., conduits). Each conduit includes a plurality of bends and line segments defined between consecutive pairs of bends or between a fitting and a module (e.g., ampoule, junction, outlet valve, etc). Due to the layout of the various components of the gas delivery system, the conduits of each channel may be routed differently. As a result, length of each line segment of channel A may be different from that of a corresponding line segment of channel B.

When testing the two chemistries, with all other remaining process parameters, such as operating temperature, flow rate, pressure of the different chemistries, etc., remaining constant, differences in the layouts of the conduits in the two channels may cause variance in the valve timings. The new design of the gas delivery system allows using the same timing sequences (i.e., valve timings) for testing different chemistries by matching the total line length of the conduits in channels A and B. Matching the layout of the conduits helps in maintaining valve timing across the two conduits, one of the key process parameters that is a cause of uneven pressure drops in the two conduits.

Figure 6:
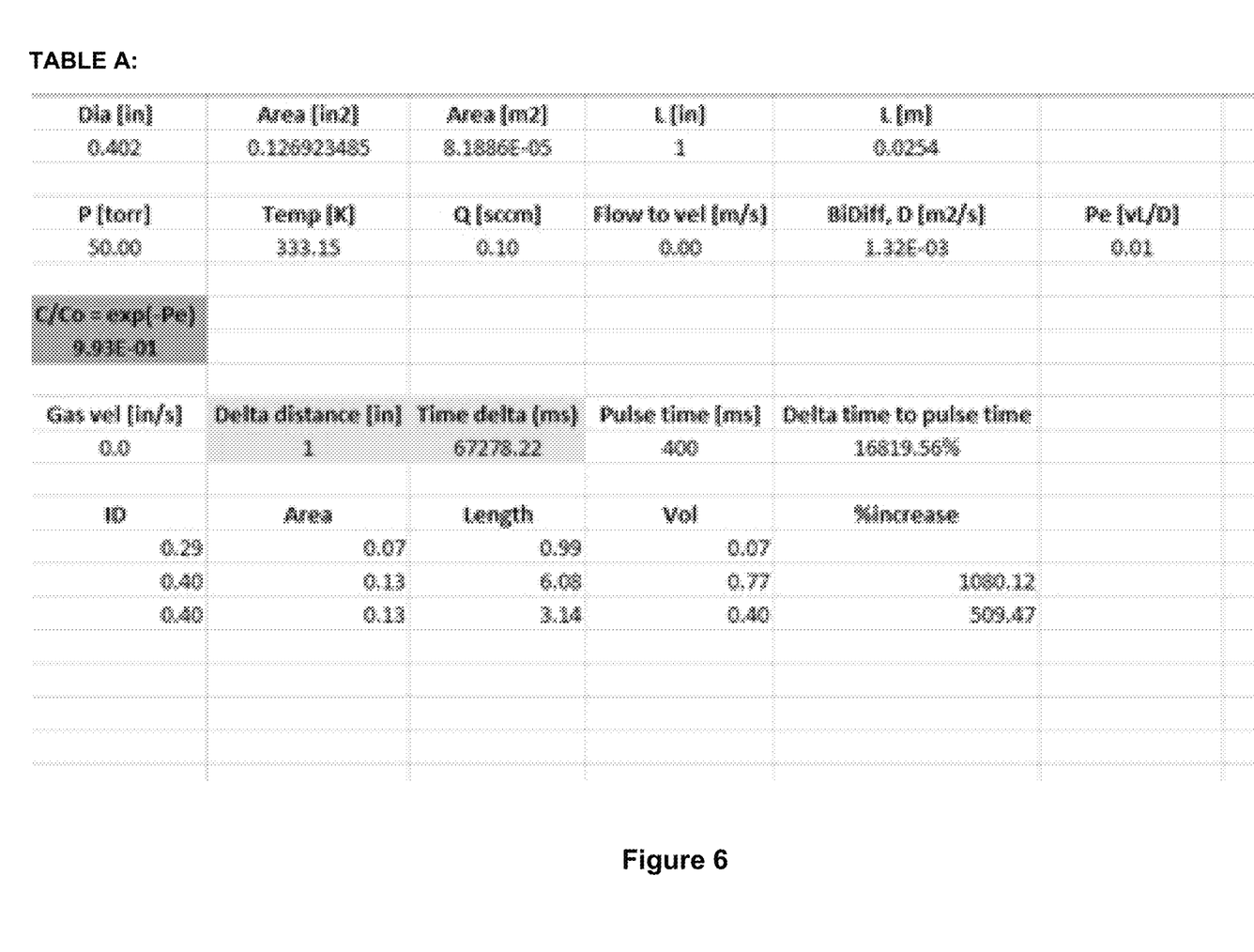
FIG. 6 illustrates an example Table A identifying process parameters used for testing different chemistries within the gas delivery system, in accordance with one embodiment.

FIG. 6 illustrates a sample table, Table A, showing the various process parameters used for obtaining comparable results when testing the different chemistries within the gas delivery system, in one embodiment. The table shows, for example, the width of the conduits of channels A and B (0.402 inches), processing chamber operating pressure in Torr (50.00 Torr), processing chamber operating temperature (333.15 K), flow rate of the chemistries in standard cubic centimeter per minute (sccm) (about 0.10 sccm), the Peclet number derivative (0.01) used in determining the diffusion distance (i.e., delta distance—about 1") separating the two conduits, among other process parameters used during testing of the different chemistries.

The various implementations described herein offer a simple and easily implementable way of testing multiple chemistries using same process parameters. The gas delivery system is designed to accommodate multiple channels, with each channel having an ampoule coupled to a distinct conduit for supplying a different chemistry to a manifold of the process chamber. Layouts of the conduits of the different channels are matched to avoid pressure drop differences in the different conduits. Inert gases are trickled through non-active channels to avoid dead-leg blocking, while an active channel is used to supply chemistry for testing. The different conduits are separated by a diffusion distance to avoid the chemistry supplied through an active channel from diffusing back into a non-active channel. Push inert gas is supplied through the common conduit to push the chemistry being tested toward the processing chamber and to prevent backflow diffusion.

The design of the gas delivery system allows the various chemistries to be tested with same valve times, without incurring significant tool down-time. The only delay in testing different chemistries may be due to a purging operation where the first chemistry supplied to a manifold in the process chamber has to be thoroughly purged from the manifold before the second chemistry can be supplied to the manifold. There is no need to break any lines to switch the ampoules as the chemistries supplied by the various ampoules are tested using the same process parameters. Additional advantages can be envisioned by one skilled in the art upon reading the various implementations.

Figure 5:
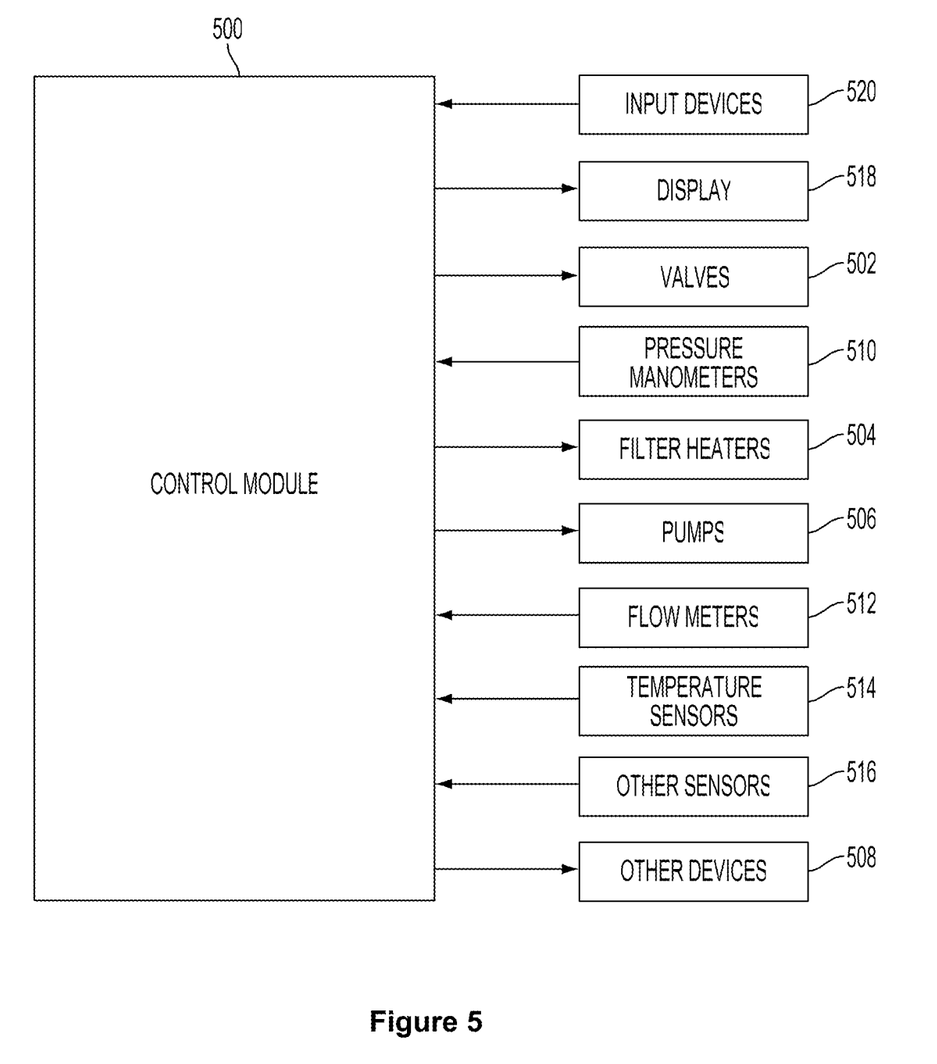
FIG. 5 shows a control module for controlling the systems, in accordance with one embodiment.

FIG. 5 shows a control module 500 for controlling process input and control of the process chamber. In one embodiment, the control module may include some example components. For instance, the control module (or controller) 500 may include a processor, memory and one or more interfaces. The controller shown in FIG. 5 is similar to control module 170 depicted in FIG. 3. The control module 500 may be employed to process recipes, control devices of the process chamber based in part on sensed values. For example only, the control module 500 may control one or more of valves 502 (including valves within the valve blocks, outlet valves, trickle controls, etc., of the gas delivery system), filter heaters 504, pumps 506, and other devices 508 based on the sensed values and other control parameters. The controller 500 receives the sensed values from, for example only, pressure manometers 510 (e.g., manometers 139 of FIG. 2), flow meters 512, temperature sensors 514, level sensors 136, and/or other sensors 516. The control module 500 may also be employed to control process conditions during precursor delivery and deposition of the film. The control module 500 will typically include one or more memory devices and one or more processors.

The control module 500 may control activities of the precursor delivery system and deposition apparatus. The control module 500 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, flow rates, and other parameters of a particular process. The control module 500 may also monitor the pressure differential and automatically switch vapor precursor delivery from one or more paths to one or more other paths. Other computer programs stored on memory devices associated with the control module 500 may be employed in some embodiments.

Typically there will be a user interface associated with the control module 500. The user interface may include a display 518 (e.g. a display screen and/or graphical software displays of the apparatus and/or process conditions), and user input devices 520 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 510 (manometers 139), level sensors 136, and thermocouples located in delivery system, the pedestal or chuck (e.g. the temperature sensors 514). Appropriately programmed feedback and control algorithms may be used with data from these sensors to maintain desired process conditions. The foregoing describes implementation of embodiments of the invention in a single or multi-chamber semiconductor processing tool or process chamber.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A gas delivery system for a processing chamber, comprising,
   a first channel for delivering a first chemistry to the processing chamber, the first channel having a first inlet valve coupled to a first chemistry source, a second inlet valve and a first outlet valve, and a second channel for delivering a second chemistry to the processing chamber, the second channel having a third inlet valve coupled to a second chemistry source, a fourth inlet valve and a second outlet valve;
   a trickle gas source connected to both the first channel via the second inlet valve and the second channel via the fourth inlet valve;
   a first junction coupled to the first outlet valve and a second junction coupled to the second outlet valve;
   a common conduit connected between the first junction and the second junction, and said first junction has an input connecting to a push gas source for receiving a push inert gas and the second junction has an output connecting to the processing chamber; and
   a controller coupled to the first and second channels, the controller programmed to receive sensed values from a plurality of sensors distributed in the first and the second channels and control operation of the first and second channels, wherein during operation, the controller is programmed to keep
   (a) only one of the first inlet valve of the first channel flowing the first chemistry or the third inlet valve of the second channel flowing the second chemistry open as an active channel and a remaining one of the first inlet valve of the first channel or the third inlet valve of the second channel is kept closed as a non-active channel at one time,
   (b) the second inlet valve and the fourth inlet valve corresponding to both the non-active channel and the active channel open and control flow of the trickle inert gas from the trickle gas source toward the first and the second junctions, such that both the first and the second junctions receive the trickle inert gas and only one of the first or the second junctions receives the first or the second chemistry, and
   (c) the push gas source turned on so as to cause the push inert gas to flow into the first junction, through the common conduit and out of the second junction pushing the trickle inert gas and one of the first chemistry or the second chemistry toward the processing chamber.

2. The gas delivery system of claim 1, wherein the first channel includes a first ampoule with a first inlet for receiving the first chemistry from a first chemistry source and a second inlet to receive the trickle inert gas from the trickle gas source, and
   wherein the second channel includes a second ampoule with a first inlet for receiving the second chemistry from a second chemistry source and a second inlet to receive the trickle inert gas from the trickle gas source.

3. The gas delivery system of claim 2, wherein the first channel further includes a first valve block coupled to the first ampoule, the first valve block having at least the first inlet valve to regulate the flow of the first chemistry from the first chemistry source into the first ampoule, and
   wherein the second channel further includes a second valve block coupled to the second ampoule, the second valve block having at least the third inlet valve to regulate the flow of the second chemistry from the second chemistry source into the second ampoule.

4. The gas delivery system of claim 2, wherein the first channel includes a first trickle control and the second channel includes a second trickle control located between the trickle gas source and respective one of the first and the second ampoules, the first trickle control including at least the second inlet valve and the second trickle control including at least the fourth inlet valve to regulate flow of the trickle inert gas from the trickle gas source into the first and second ampoules.

5. The gas delivery system of claim 2, wherein each of the first and the second ampoules includes one or more level sensors coupled to a spill detector valve, the one or more level sensors configured to generate a signal to the spill detector valve indicative of a level of the first or the second chemistries in the corresponding first or the second ampoules,
   the spill detector valve configured to control flow of the first or the second chemistries to the corresponding first or second ampoules.

6. The gas delivery system of claim 2, wherein components of each of the first and the second channels are located symmetric to each other within the gas delivery system.

7. The gas delivery system of claim 1, wherein a layout of the first channel matches a layout of the second channel.

8. The gas delivery system of claim 7, wherein the layout is defined by a total line length, a number of bends, a line width, and a number of fittings of a conduit in each of the first and second channels, and wherein the total line length of the conduit is computed as a sum of length of each line segment, wherein a line segment is defined between consecutive pair of bends, and
   wherein matching the layout of the conduit of the first channel to the conduit of the second channel includes matching the total line lengths, the number of fittings, the number of bends and the line width.

9. The gas delivery system of claim 8, wherein the total line length of the conduit of the first channel includes a length of a line segment of the common conduit between the first junction and the second junction.

10. The gas delivery system of claim 1, wherein the flow of the trickle inert gas into the non-active one of the first or the second channels is to avoid dead-leg within.

11. The gas delivery system of claim 1, wherein a length of the common conduit between the first junction and the second junction is defined to avoid diffusion of the first or the second chemistries into the non-active one of the first or second channels.

12. The gas delivery system of claim 11, wherein the length is derived as a Peclet number.

13. The gas delivery system of claim 1, wherein the trickle inert gas and the push inert gas are Argon.

14. A gas delivery system for a processing chamber, comprising:
   a first channel for delivering a first chemistry to the processing chamber, the first channel includes a first ampoule coupled to a first chemistry source and a trickle gas source, wherein the first ampoule includes a first inlet operated by a first inlet valve for receiving the first chemistry from the first chemistry source and a second inlet operated by a second inlet valve for receiving a trickle inert gas from the trickle gas source, the first channel having a first outlet valve;
   a second channel for delivering a second chemistry to the processing chamber, the second channel includes a second ampoule coupled to a second chemistry source and the trickle gas source, wherein the second ampoule includes a first inlet operated by a third inlet valve for receiving the second chemistry from the second chemistry source and a second inlet operated by a fourth inlet valve for receiving the trickle inert gas from the trickle gas source, the second channel having a second outlet valve;

a first junction is coupled to the first outlet valve and has an input connecting to a push gas source for receiving a push inert gas, and a second junction is coupled to the second outlet valve and has an output connecting to the processing chamber;

a common conduit connected between the first junction and the second junction; and a controller coupled to the first and second channels, the controller programmed to receive sensed values from a plurality of sensors distributed in the first and the second channels and control operation of the first and second channels, wherein during operation, the controller is programmed to keep (a) only one of the first inlet valve of the first channel flowing the first chemistry or the third inlet valve of the second channel flowing the second chemistry open to define an active channel and a remaining one of the first inlet valve of the first channel or the third inlet valve of the second channel closed to define a non-active channel at one time, (b) the second inlet valve and the fourth inlet valve corresponding to both the non-active channel and the active channel open to control flow of the trickle inert gas from the trickle gas source toward the first and the second junctions, such that both the first and the second junctions receive the trickle inert gas and only one of the first or the second junctions receives the first or the second chemistry, and (c) the push gas source turned on to cause the push inert gas to flow into the first junction, through the common conduit and out of the second junction pushing the trickle inert gas and one of the first chemistry or the second chemistry toward the processing chamber.

15. The gas delivery system of claim 14, wherein the first channel further includes a first valve block located between the first chemistry source and the first ampoule, the first valve block having at least the first inlet valve to regulate the flow of the first chemistry from the first chemistry source into the first ampoule, and wherein the second channel further includes a second valve block located between the second chemistry source and the second ampoule, the second valve block having at least the third inlet valve to regulate the flow of the second chemistry from the second chemistry source into the second ampoule.

16. The gas delivery system of claim 14, wherein each of the first and the second ampoules includes one or more level sensors coupled to a spill detector valve, the one or more level sensors configured to generate a signal to the spill detector valve indicative of a level of the first or the second chemistries in the first or the second ampoules, the spill detector valve configured to control flow of the first or the second chemistries into the corresponding first or second ampoules.

17. The gas delivery system of claim 14, further includes a manometer coupled to each of the first and the second ampoules, the manometer configured to control pressure of the first or the second chemistries flowing from the first or the second ampoules toward the first or second outlet valves.

18. The gas delivery system of claim 14, wherein each of the first channel and the second channel includes a conduit, the conduit of the first channel connecting the first ampoule to the first junction and the conduit of the second ampoule connecting the second ampoule to the second junction, a layout of the conduit in the first channel matches a layout of a conduit in the second channel.

19. The gas delivery system of claim 18, wherein the layout of each conduit is defined by a total line length, a number of bends, a line width, and a number of fittings, the total line length computed as a sum of length of line segments of each conduit, wherein each line segment is defined between consecutive pair of bends, and wherein matching the layout of the conduit of the first channel to the layout of the conduit of the second channel includes matching the total line length, the number of fittings, the number of bends and the line width.

20. The gas delivery system of claim 14, wherein the trickle inert gas and the push inert gas are Argon.

* * * * *